United States Patent [19]

Krebs, Jr.

[11] 4,375,678
[45] Mar. 1, 1983

[54] REDUNDANT MEMORY ARRANGEMENT PROVIDING SIMULTANEOUS ACCESS

[75] Inventor: Robert H. Krebs, Jr., San Juan Capistrano, Calif.

[73] Assignee: Sperry Corporation, New York, N.Y.

[21] Appl. No.: 181,069

[22] Filed: Aug. 25, 1980

[51] Int. Cl.³ ............................................. G11C 13/00
[52] U.S. Cl. .................................... 365/238; 365/189
[58] Field of Search ................ 365/238, 244, 189, 230

[56] References Cited

U.S. PATENT DOCUMENTS 3,753,242 8/1973 Townsend ............... 365/244.7 WF
3,772,658 11/1973 Sarlo .................................. 365/238

Primary Examiner—Terrell W. Fears
Attorney, Agent, or Firm—G. Donald Weber, Jr.; Eugene T. Battjer

[57] ABSTRACT

A memory system for a data processing apparatus including a stack and a stack image memory which provides either sequential or simultaneous access to information contained on the stack. A stack control logic unit is responsive to a stack instruction so that information written into the stack is simultaneously written into one or more random access memory units. Moreover, a sequence of information items read sequentially from the stack may be read simultaneously from different random access memory units. The memory address unit is preferably implemented with programmable read-only memories.

21 Claims, 3 Drawing Figures

REDUNDANT MEMORY ARRANGEMENT PROVIDING SIMULTANEOUS ACCESS

BACKGROUND OF THE INVENTION

1. Field of the Invention.

The invention relates to memory systems for data processing apparatus, and more particularly to redundant memory systems in which a predetermined sequence of information items stored in a memory portion can be accessed simultaneously.

2. Description of the Prior Art.

Data processing systems incorporating redundant memories are known in the prior art. Generally, redundant memories are intended to improve system reliability through the incorporation of error detection circuitry. Once an error has been detected by such circuitry, the redundant memories are used to determine the correct value of the information item stored. Another type of redundant memory is the buffer or cache store. The buffer or cache store contains information items which require much more rapid access than information items which are stored in the relatively slower main memory. In many implementations of a buffer or a cache store, the same information item is stored in both the buffer store and the main memory. In such prior art implementation of redundant memory systems, the buffer store merely repeats the information items stored in a portion of the main memory, and the processor accesses the buffer store in the same manner it would access the main memory. Although such implementations have the advantage of providing quicker access to a particular portion of the main memory, the organization of the buffer store in terms of its data structure is no different from that of the main memory.

Data processing systems incorporating stacks also are known in the prior art to include buffers, thereby providing a form of redundancy. In U.S. Pat. No. 3,905,023 there is described a data processing system adapted for processing program code strings based upon Polish notation. The constants and variables of the program are assigned locations within the stack of a program when it is compiled. In the preferred embodiment the stack implementation includes a stack buffer which permits a portion of an active stack to be contained in IC memory locations. The stack buffer in such a system may contain information items which have not yet been written into the main memory, as well as copies of information items which are resident in main memory. The stack buffer permits a portion of the stack to be held locally within the central processing module, thereby providing quick access for stack manipulation by the central processor.

Although various implementations of memory redundancy are known in the prior art, such implementations do not change the data structure or the organization of the information items stored. Prior to the present invention there has not been a memory redundancy organization which utilizes the random access organization of memories in order to read and write data from or to the redundant memory in a manner different from that of the original memory, or in a manner which expresses a particularly useful data structure or access protocol.

SUMMARY OF THE INVENTION

Briefly, and in general terms, the invention provides a memory system for data processing apparatus including a stack memory for storing successive items of information, and a stack image memory for storing the same items of information as an array of simultaneously accessible items. In a preferred embodiment, the stack image memory is composed of a plurality of individual random access memory integrated circuits, and each stack operation results in a corresponding operation in each of the memory circuits. A data information item written into the stack will be written into each of the memory circuits. A stack control logic unit and a RAM address generator controls the write operation so that the identical items of information are written into appropriate addresses in each memory circuit. In a preferred embodiment, the RAM address generator writes the same item of information into different but successive addresses in each of the memory circuits, thereby enabling the contents of the stack in the vertical direction (i.e. from the last-in to the first-in item of information) to be read simultaneously from the memory circuits by reading the memory circuits horizontally.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF A PREFERRED EMBODIMENT

Figure 1:
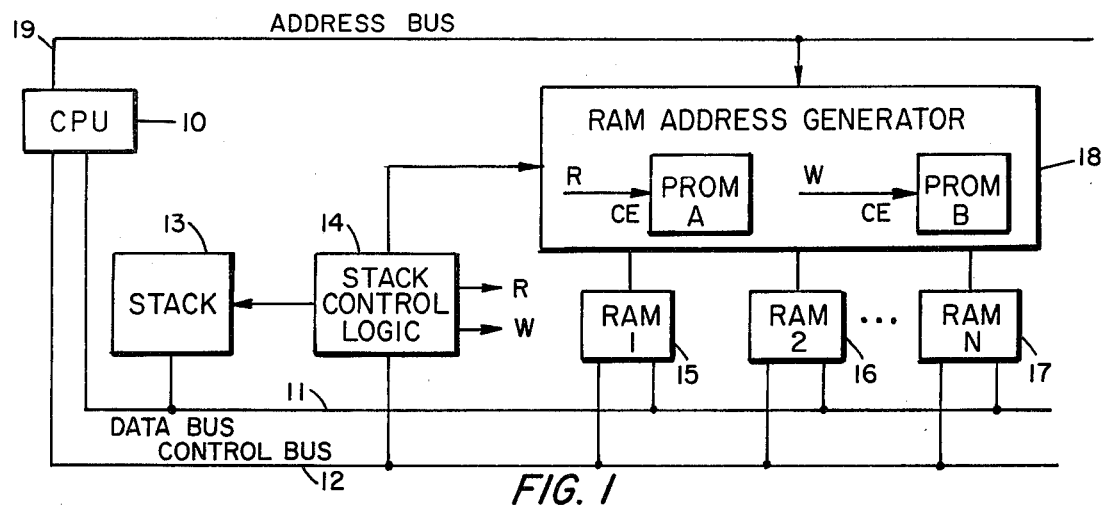
FIG. 1 is a highly simplified block diagram of a first embodiment of the present invention.

Turning first to FIG. 1, there is shown a highly simplified block diagram of a portion of a data processing system including the present invention. Although the computer architecture illustrated in FIG. 1 is a bus-oriented von Neumann architecture, it is understood that the architecture shown is only one embodiment of the present invention, and the same invention can be implemented in systems without busses, or in systems which are not based upon von Neumann architecture.

The central processing unit (CPU) 10 represents a conventional functional unit capable of performing arithmetic or logical operations in a sequential manner under program control. In the present embodiment, the CPU 10 is connected to a data bus 11, a control bus 12, and an address bus 19. The data bus 11 may be bidirectional so that it is capable of supplying data from the CPU 10 as well as providing instructions and data to the CPU 10. In a data processing system including a stack according to the present invention, it is assumed that some of the instructions of the instruction set of the CPU are stack manipulation instructions, such as "PUSH" (i.e. write data onto the stack) or "POP" (i.e. read data from the top of the stack.) However, it must be realized that the present invention may also be implemented in microprogrammable systems which use a stack, even though the user instruction set does not contain stack manipulation instructions.

The stack 13 is a memory which stores information in the form of a last-in, first-out stack of sequentially accessible items. The stack 13 may be implemented as a special set of registers in the computer, or as a portion of main memory. The stack 13 is connected to the data bus 11 so that data transfer to or from the stack 13 takes place over the data bus. One of the advantages of the stack is that it provides a means of organizing data into a specific sequence of data items which can be accessed only in a predetermined manner, such as "popping" data from the stack in a last-in, first-out manner. Such an organization is useful for performing interrupt operations, for example, in which the data from various machine registers may be pushed onto the stack to save such data during processing of the interrupt. A disadvantage of the stack is that data items which are not at the "top" of the stack are not immediately accessible from the stack. The hardware configuration according to the present invention overcomes such a disadvantage.

The stack control logic unit 14 provides a means of controlling the stack 13, memory units 15, 16, and 17, and the RAM address generator 18 as provided in the present invention. The stack control logic unit 14 is responsive to a stack instruction, which may be specified by an appropriate combination of signals on the control bus 12. The stack control logic unit is responsive to a stack instruction to permit the incoming data item to be placed in the stack memory, and to adjust the pointer associated with the stack so that the newly stored data item is now at the top of the stack. Similarly, when information is to be read from the stack, the data item associated with the pointer which indicates the top of the stack is read out over the data bus, and the stack pointer is advanced to the memory location of the next stored data item which is now considered to be the top of the stack.

The RAM address generator 18 is responsive to the stack control logic unit 14 to generate appropriate addresses for each of the memory units 15, 16 and 17. The generator 18 includes, for example, PROM A which is activated by a read signal R from the stack control logic unit 14, and PROM B which is activated by a write signal w from the stack control logic unit 14. The two PROMs generate different addresses for the memory units depending upon whether a read or a write signal is enabled. Of course, other circuit configurations can be used to perform this function. The memory units 15, 16 and 17 are preferably random access memory circuits of substantially identical design operating in parallel to achieve the memory redundancy as required in the present invention. In a preferred embodiment, each unit 15, 16 and 17 is implemented with a single IC component. Although only three memory units 15, 16 and 17 are shown for simplicity, the actual number of units may be chosen, as necessary, for a given system or applications, and is typically greater than three.

The memory units 15, 16 and 17 operate in parallel in the sense that a given data item written into the stack 13 is also written simultaneously into each of the memory units 15, 16 and 17. The memory units 15, 16 and 17 are connected to the data bus 11 and the control bus 12, so that when a stack "push," or write, selection is specified by the CPU, the "chip select" pin on each of the IC's corresponding to the memory units 15, 16 and 17 will be activated, and the data currently on the data bus will be written into the memory units and stored therein.

The consequence of operating the memory units 15, 16 and 17 in parallel with the stack 13 is that if information items designated A, B, C and D are stored in the stack 13, then A, B, C and D are stored in unit 15; A, B, C and D are stored in unit 16; and A, B, C and D are stored in unit 17.

The addresses of the information items A, B, C and D in each of the memory units 15, 16 and 17 are determined by the RAM address generator 18. The addresses need not be identical for each memory unit and may be appropriately chosen depending upon the system or application. For example, in memory unit 15 the information items may be stored as A, B, C and D (from low-order to high-order memory location), and in unit 16 as B, C, D and A (from low-order to high-order). The combination of memory redundancy and the ability to simultaneously access the stored items of information in each of the memory units 15, 16 and 17 achieves one of the principal objectives of the present invention. The ability to change the memory address arrangements for each of the memories by changing the RAM addresses provided by the RAM address generator 18 enables the user to specify the particular type of data structure for the information being simultaneously accessed, which is another of the principal objectives of the invention.

One of the preferred applications of the present invention is a stack tracker. In the most general form of the present invention, the unit 13 is a memory portion with an arbitrary data structure. In one embodiment, the unit 13 has a well-defined data structure as a last-in, first-out stack. The memory units 15, 16 and 17 then function as a stack tracker, i.e. a memory which tracks the data pushed and popped from the stack 13. An example of the operation of the present invention will be explained subsequently with reference to FIG. 3.

Figure 3:
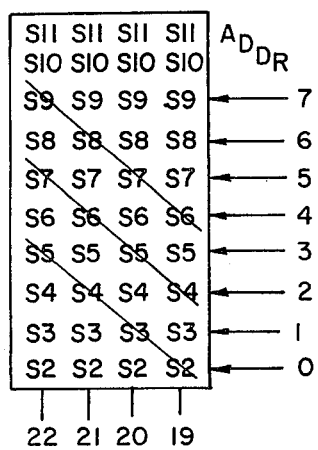
FIG. 3 is a diagram illustrating how data items are stored in the random access memories.

Turning now to FIG. 3, there is shown a more detailed schematic diagram of the array of random access memories and an address generator according to the present invention. There are shown random access memories 19, 20, 21 and 22 which form the stack image memory according to the present invention. The random access memories 19, 20, 21 and 22 are similar to the units 15, 16 and 17 in FIG. 1, and are also single IC components in a preferred embodiment.

Each IC memory 19, 20, 21 and 22 has a write input WE connected to a single write line 23, and a read input TSEN connected to a single read line 24. Each memory also has a data input connected to a single data line 26. A consequence of such arrangement is that data supplied on the data line 26 is written into each of the memories simultaneously, and each item of information or data is stored in each of the memories. The same items of data are preferably stored in the same location or addresses in each of the memories, although in other embodiments the addresses may be different.

The memory address generator consists of a plurality of adders 27, 28, 29 and 30. Each adder corresponds to a respective one of the random access memories 19, 20, 21 and 22, and is connected thereto by discrete address lines 31, 32, 33 and 34. The first input to each of the adders consists of a 4-bit input from a track counter. The second input to each of the adders is derived from a logic circuit, or alternatively from a programmable read only memory.

The generation of appropriate memory addresses may be operatively controlled depending upon whether information is being written into the memory or read from the memory. Different addresses for reading and writing are used in the present invention in order to achieve a different structuring or organization of the data which is contained in the memories.

When writing data into the memories, a first set of programmable read-only memories is used which provides the same address for each of the random access memories. That is, address A is provided to memory 19, address A to memory 20, address A to memory 21, and so on.

When reading data from the memories, a second set of programmable read-only memories are used.

During reading, the use of programmable read-only memories provides a technique of automatically providing a sequence of addresses to respective ones of the random access memories 19, 20, 21 and 22. The programmable read only memories may be programmed so that the sequence of addresses generated during a read operation provides successive addresses to each successive memory, for example. Thus, if address A is provided to memory 19, address A+1 is provided to memory 20, A+2 to memory 21, A+3 to memory 22, and so on.

Since the same data is applied to each of the random access memories, a complete data history is present in each of the memories 19, 20, 21 and 22. However, such data is organized or structured in a different sequence in each memory. That is, the data is read from each of the memories in a manner different from the manner in which it is written so that the user may access the data in a manner more appropriately for a given application than in the manner in which it is stored in any one memory.

FIG. 3 illustrates how data items may be stored in four identical random access memory units 19, 20, 21 and 22. FIG. 3 illustrates, in highly schematic form, the contents of memories 19, 20, 21 and 22.

Each memory is represented by a column with the data stored at each address (from address 0 to address 7) shown in the column. Thus, S2 represents a data item stored in address 0 of each memory 19, 20, 21 and 22. Likewise, S3 represents a different data item stored in address 1 of each memory 19, 20, 21 and 22; and so on.

Figure 2:
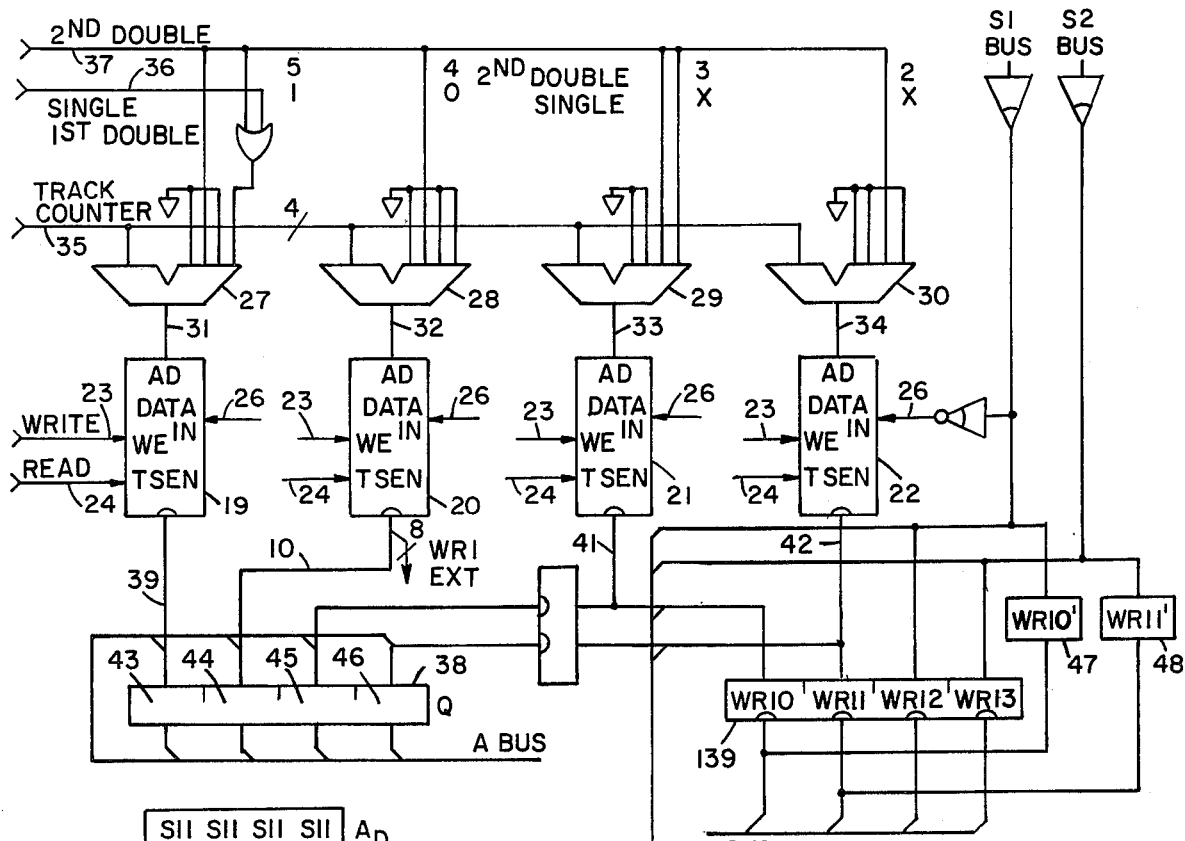
FIG. 2 is a more detailed schematic diagram of the array of random access memories and an address generator according to the present invention.

The arrangement of data shown in FIG. 3 is that of the stack tracker embodiment of FIG. 2 in which the data items S2-S11 are written into the memories 19-22 all with the same address for each data item Si, where i=2, ... 11.

When reading the memories 19-22 in order to reconfigure the data, the addresses for each of the memories 19-22 are incremental in sequence. In this example in FIG. 3, the sequence is from 0-3 as shown by the line drawn through the Si. This sequence is the order in which data will be read out in parallel, i.e. S5, S4, S3, S2.

Returning to the discussion of FIG. 2, each of the memories 19-22 has a respective output 39-42. Each of these outputs 39-42 is connected to a register portion 43-46, respectively, of a register 38. The register 38 is, therefore, four words in width and simultaneously receives data items from each of the memories 19-22 for storage and later processing.

Returning to the example of FIG. 3, the data item S2 will be read out of memory 19, the data item S3 will be read out of memory 20, the data item S4 will be read out of memory 21, and the data item S5 will be read out of memory 22. Thus, the data item S2 will be loaded into register portion 43, data item S3 into register portion 44, data item S4 into register portion 34, and data item S5 into register portion 46. In effect, the register 38 will concatenate the individual data items to form a single register word.

Register 38 is connected to the A bus so that the data word consisting of portions S2, S3, S4 and S5 can be transferred to the A bus and used for further processing by the system.

The effect of the "diagonal" reading of the memories 19-22 is that the data stored in the stack in a sequential manner can now be read out in parallel, placed in a register 38 and transferred to a bus for processing by the system. Of course the "diagonal" read-out of the memories 19-22 is only one example of a data structure which can be generated and loaded in register 38.

The system described above with one register 38 is only one simple implementation of the system. Other registers like register 139 may also be used to further increase the number of word combinations it is possible to generate based upon the output of memories 19-22. Register 139 is also connected to an S0 bus and an S1 bus, so that data items S0 and S1 may also be appended to data items S2, and so on, from memories 19-22.

Thus, there is shown and described a unique memory apparatus for use with data processing equipment. The principal objectives and features are noted. However, the specific implementation is intended to be illustrative only. Thus, those skilled in the art may conceive modifications to the illustrated implementation. However, any such modifications which fall within the purview of this description are intended to be included therein as well. The implementation is not intended to be limitative. Rather, the scope of the invention is defined by the claims appended hereto.

Having thus described a preferred embodiment of the invention, what is claimed is:

1. A memory system for data processing apparatus including a stack, comprising:
 a logical functional unit having an input for receiving operands for performing stack operations, and an output;
 data bus means coupled to the output of said functional unit;
 stack memory means coupled to said data bus means for storing successive items of information on said data bus means in the form of a stack of sequentially accessible items;
 stack image memory means coupled to said data bus for storing said successive items of information in the form of an array of simultaneously accessible items;
 said stack image memory means comprises a plurality of substantially identical random access memory circuits; and
 memory address means connected to each of said random access memory circuits for providing respective addresses to each of said random access memory circuits for storing each of said items of information.

2. The memory system recited in claim 1, wherein said stack memory means comprises a last-in, first-out stack.

3. The memory system recited in claim 1, wherein each item of information stored in said stack memory means is stored in each one of said memory circuits.

4. The memory system recited in claim 1, wherein said plurality of memory circuits comprise individual integrated circuits.

5. The memory system recited in claim 1, wherein said memory address means comprises a write mode and a read mode, wherein different respective addresses are applied to said random access memory circuits in said write mode and in said read mode.

6. The memory system recited in claim 5, wherein the same addresses are applied to each of said random access memory circuits in said write mode.

7. The memory system recited in claim 5, wherein the respective addresses applied to each of said random access memory circuits are different in said read mode.

8. The memory system recited in claim 7, wherein said respective addresses for each of said random access memory circuits are successive addresses.

9. The memory system recited in claim 1, wherein said memory address means comprises a plurality of read-only memories for automatically generating said respective addresses for each of said random access memory circuits.

10. The memory system recited in claim 1, including register means connected to the output of each of said random access memory circuits.

11. The memory system recited in claim 10, wherein, said register means comprises a plurality of adjacent register portions, each of said portions connected to a corresponding one of said random access memory circuits, said register means functioning to form a single register word from the simultaneous data output of each of said random access memory units.

12. A data processing system comprising, first memory means for storing a set of information words; said first memory means having a first operating mode of accessing said information words stored therein; a plurality of second memory means; each of said second memory means storing said set of information words and having a second operating mode of accessing said information words stored therein; addressing means operatively connected with each of said second memory means for accessing predetermined selected ones of said information words in each of said second memory means; each of said accessed information words being provided on a respective output of each of said second memory means; and register means connected to all of said respective outputs of each of said second memory means so as to store and concatenate said accessed information words as a single register word.

13. The data processing system recited in claim 12, wherein, said first memory means is a stack, and said first operating mode of accessing said information words is sequentially on a last-in, first-out basis.

14. The data processing system recited in claim 12 wherein, said second operating mode of accessing said information words is random access addressing.

15. The data processing system recited in claim 12 wherein, said addressing means has a first mode of operation resulting in the generation of a first set of addresses for respective ones of said second memory means, and a second mode of operation resulting in the generation of a second set of addresses for respective ones of said second memory means.

16. The data processing system recited in claim 12 wherein said first mode of operation comprises writing information words into said second memory means, and said second mode of operation comprises reading information words from said second memory means.

17. The data processing system recited in claim 15 wherein, said first set of addresses comprise a set of identical addresses for each of the respective ones of said second memory means, and said second set of addresses comprise a set of different addresses for each of the respective ones of said second memory means.

18. A data processing system comprising a first memory module for storing a plurality of items of information having a first data structure; a plurality of substantially identical second memory modules, each of said second modules storing said items of information having a second data structure different from said first data structure; data input/output means connected to said first memory module for transferring said items of information thereto and therefrom; tracking logic means connected to said first memory module and responsive to the transfer of one of said items of information to produce an enabling signal; and access means connected to said second modules and responsive to said enabling signal to perform a corresponding transfer of corresponding items of information stored in respective ones of said second modules.

19. The data processing system recited in claim 18, wherein, said first memory module is a memory having a last-in, first-out data structure.

20. The data processing system recited in claim 18, wherein, said second memory modules comprise read/write memories having a random access data structure.

21. The data processing system recited in claim 18, wherein, said access means comprise memory addressing means connected to each of said substantially identical second memory modules for providing respective addresses thereto.

* * * * *